(12) United States Patent
Suzuki et al.

(10) Patent No.: US 7,098,837 B2
(45) Date of Patent: Aug. 29, 2006

(54) A/D CONVERTER

(75) Inventors: Hisao Suzuki, Kasugai (JP); Osamu Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/146,069

(22) Filed: Jun. 7, 2005

(65) Prior Publication Data

US 2006/0164278 A1    Jul. 27, 2006

(30) Foreign Application Priority Data

Jan. 27, 2005    (JP)    ............................. 2005-020142

(51) Int. Cl.
*H03M 1/12*    (2006.01)
(52) U.S. Cl. ...................... 341/155; 341/156; 341/158; 341/19
(58) Field of Classification Search ................ 341/155, 341/156, 158, 159, 120, 162, 137
See application file for complete search history.

(56) References Cited

U.S. PATENT DOCUMENTS

| | | | |
|---|---|---|---|
| 4,752,766 A * | 6/1988 | Shimizu et al. ............. | 341/159 |
| 5,046,158 A * | 9/1991 | Groen ........................ | 341/137 |
| 5,579,006 A * | 11/1996 | Hasegawa et al. .......... | 341/162 |
| 5,675,341 A * | 10/1997 | Vallancourt et al. ........ | 341/158 |
| 5,689,260 A * | 11/1997 | Vallancourt ................. | 341/156 |
| 5,815,107 A * | 9/1998 | Frankeny et al. ........... | 341/159 |
| 6,121,913 A * | 9/2000 | Glass et al. ................. | 341/159 |
| 6,232,897 B1 * | 5/2001 | Knusen ...................... | 341/120 |
| 6,324,197 B1 * | 11/2001 | Suda ........................ | 372/38.01 |
| 6,456,210 B1 * | 9/2002 | Aunio et al. ................ | 341/110 |
| 6,731,231 B1 * | 5/2004 | Roovers et al. ............. | 341/156 |

FOREIGN PATENT DOCUMENTS

| | | |
|---|---|---|
| JP | 8-79078 A | 3/1996 |
| JP | 9-98033 A | 4/1997 |

OTHER PUBLICATIONS

Carreira J.P et al.; "A two-step flash ADC for digital CMOS technology", Advanced A-D and D-A Conversion Techniques and their applications, 1994. Second International conference on Cambridge, UK, London, UK, IEE, UK, 1994, pp. 48-51, XP006512800, no month.

Shukla R et al., "A low voltage rail to rail V-I conversion scheme for applications in current mode A/D converters" Circuits and Systems, 2004, ISCAS '04. Proceedings of the 2004 International Symposium on Vancouver, BC, Canada May 23-26, 2004, Piscataway, NJ, USA, IEEE, US, pp. I-916, XP010719476.

V.Tipsuwanporn, et al.; "Algorithimic ADC Using Current Model Without DAC"; Circuits and Systems 2002; vol. 1; Oct. 28, 2002; pp. 453-455.

M.S. Bhat, et al.; "Static Power Minimization in Current-Mode Circuits"; Design Automation Conference; Jan. 18, 2005; pp. 1220-1223.

* cited by examiner

*Primary Examiner*—Jean Bruner Jeanglaude
(74) *Attorney, Agent, or Firm*—Arent Fox PLLC

(57) ABSTRACT

A current mode A/D converter for reducing current consumption while enhancing resolution. The A/D converter includes a V/I conversion circuit for sampling and converting an input voltage to a current, an I/V conversion circuit for converting the current supplied from the V/I conversion circuit to a comparison voltage, a comparator for comparing the current based on the comparison voltage and a reference current, and an encoder for generating a digital output signal based on the output signal of the comparator.

11 Claims, 7 Drawing Sheets

A/D CONVERTER

CROSS-REFERENCE TO RELATED APPLICATIONS

This application is based upon and claims the benefit of priority from the prior Japanese Patent Application No. 2005-020142, filed on Jan. 27, 2005, the entire contents of which are incorporated herein by reference.

BACKGROUND OF THE INVENTION

The present invention relates to an A/D converter for converting an analog input voltage to a digital signal having a plurality of bits.

A/D converters are installed in various types of electronic equipment to convert analog input voltage to a digital signal. In such A/D converters, comparators are supplied with reference voltages that have become finer due to lower power supply voltages and higher output signal resolution (increased number of bits). For instance, a reference voltage must be generated by dividing the power supply voltage by 1024 to obtain a digital output signal having 10 bits. If the power supply voltage is low, it becomes difficult to generate the reference voltage.

A current mode A/D converter for converting analog input voltage to a current and then comparing the converted current with a reference current with a plurality of comparators has been proposed. In such a current mode A/D converter, the reference voltage does not need to be prepared by dividing the power supply voltage. Thus, even if the power supply voltage is lowered, the current A/D converter is applicable for higher resolution of the A/D conversion operation, that is, for increased number of bits in the output signal.

Japanese Laid-Open Patent No. 8-79078 describes a serial-parallel A/D converter that performs A/D conversion through voltage comparison for higher ranks and A/D conversion process through current comparison for lower ranks. Thus, the serial-parallel A/D converter is applicable for lower power supply voltages.

Japanese Laid-Open Patent No. 9-98033 describes a circuit similar to the current-voltage conversion circuit used in the current mode A/D converter.

SUMMARY OF THE INVENTION

In the current mode A/D converters described above, current corresponding to the analog input voltage must be supplied to each comparator in order to compare the current corresponding to the analog input voltage with the reference current in each of a plurality of comparators. That is, current generation circuits, the number of which corresponds to the number of comparators, must be employed. Further, each comparator must be supplied with the same current. Therefore, if the number of comparators increases as the bits and resolution of the output signal increases, the number of current generation circuits increases. This increases the current consumption. Further, it is difficult to accurately supply a plurality of comparators with the same current corresponding to the analog input voltage.

The present invention provides a current mode A/D converter that reduces current consumption while increasing resolution.

One aspect of the present invention is an A/D converter including a V/I conversion circuit for converting input voltage to current. An I/V conversion circuit, connected to the V/I conversion circuit, converts the current of the V/I conversion circuit to voltage as a comparison voltage. A plurality of comparators are connected to the I/V conversion circuit. Each comparator receives the comparison voltage from the I/V conversion circuit, compares current based on the comparison voltage with a reference current, and generates a comparison signal indicating the comparison result. An encoder, connected to the comparators, generates a digital output signal using the comparison signals of the comparators.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
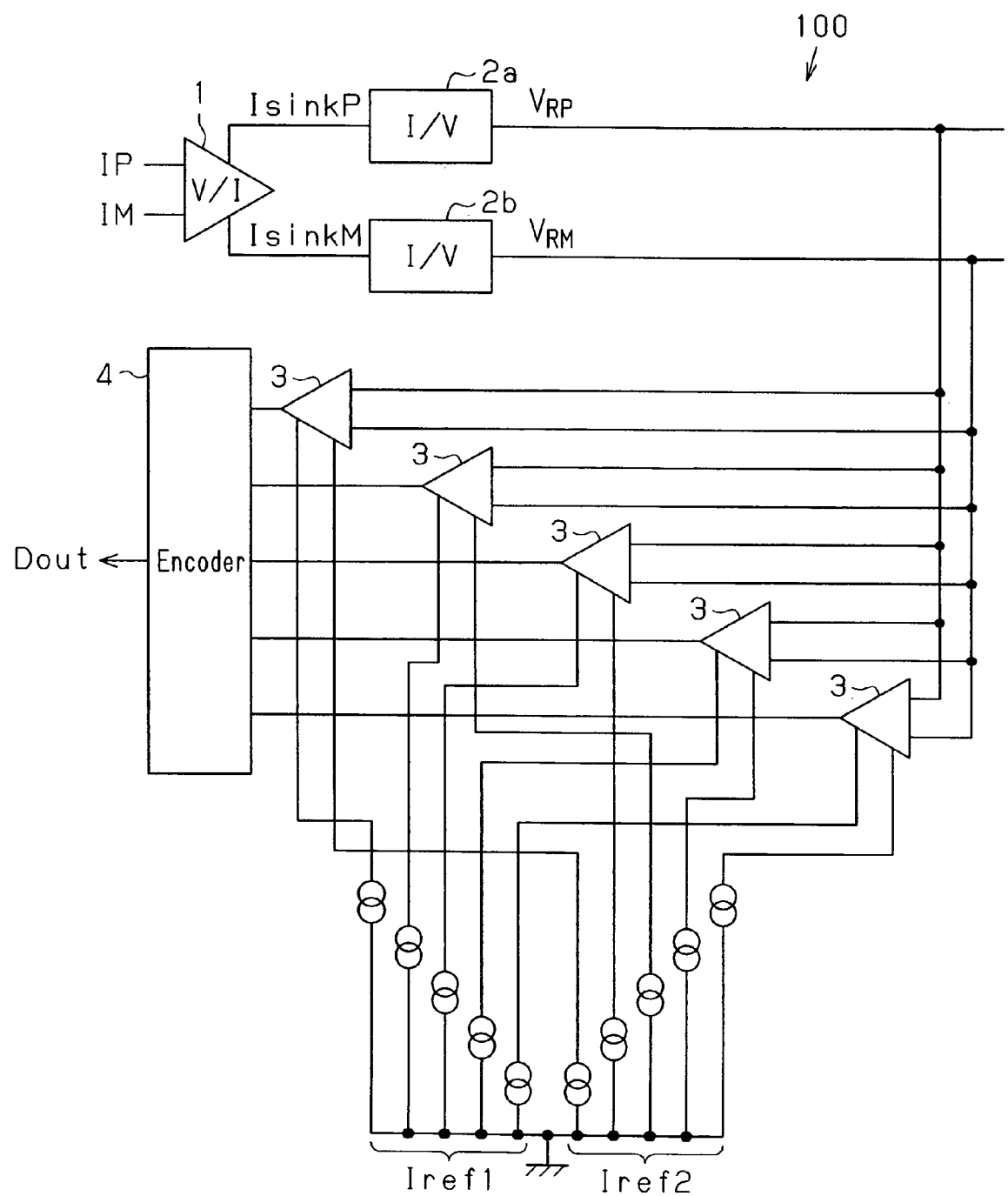
FIG. 1 is a schematic block circuit diagram showing a current mode A/D converter according to a first embodiment of the present invention.

FIG. 1 is a schematic block circuit diagram of a current mode A/D converter 100 according to a first embodiment of the present invention. The A/D converter 100 includes a V/I conversion circuit 1, I/V conversion circuits 2a and 2b, a plurality of comparators 3, and an encoder 4.

The V/I conversion circuit 1 receives analog input voltages IP and IM as a differential input voltage, converts the differential input voltages IP and IM to currents IsinkP and IsinkM, and supplies the currents IsinkP and IsinkM to the I/V conversion circuits 2a and 2b, respectively.

The I/V conversion circuits 2a and 2b respectively convert the currents IsinkP and IsinkM to comparison voltages $V_{RP}$ and $V_{RM}$ and supply the comparison voltages $V_{RP}$ and $V_{RM}$ to each of a plurality of comparators 3. Each comparator 3 compares a current, which is based on the comparison voltages $V_{RP}$ and $V_{RM}$, with the reference current $I_{ref}$ and provides a signal indicating the comparison result to the encoder 4.

The encoder 4 converts the output signals of the comparators 3 to binary signals and generates a digital output signal Dout.

Figure 2:
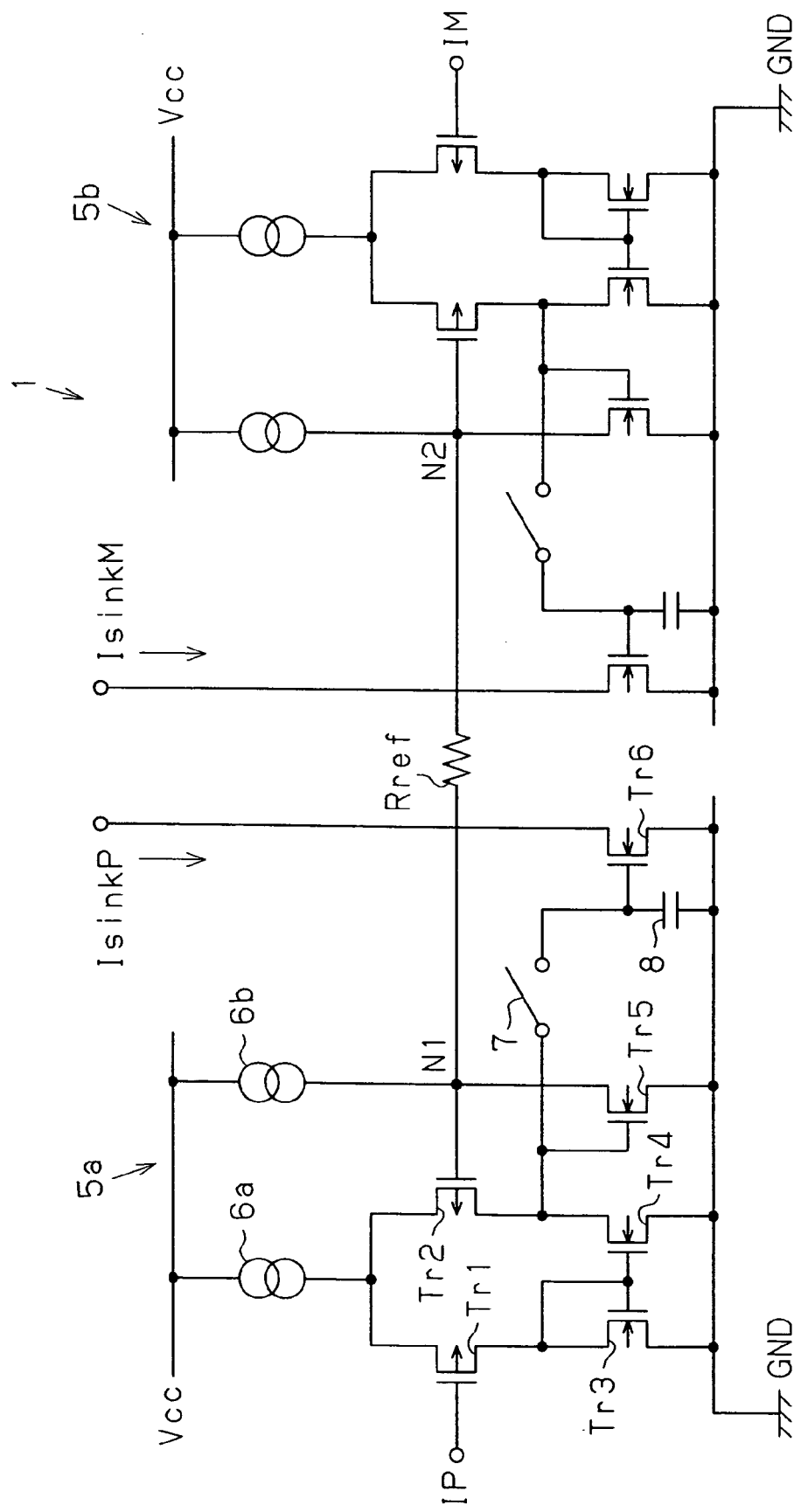
FIG. 2 is a schematic circuit diagram showing a V/I conversion circuit of the current mode A/D converter shown in FIG. 1.

The configuration of the V/I conversion circuit 1 will now be described in detail with reference to FIG. 2. The V/I conversion circuit 1 includes conversion sections 5a and 5b respectively corresponding to the input voltages IP and IM. A node N1 of the conversion section 5a and a node N2 of the conversion section 5b are connected by a reference resistor Rref.

In the conversion section 5a, the input voltage IP is supplied to the gate of a p-channel MOS transistor Tr1. The gate of a p-channel MOS transistor Tr2, which is paired with the p-channel MOS transistor Tr1, is connected to the node N1. A current source 6a supplies bias current to the sources of the transistors Tr1 and Tr2.

The drains of the transistors Tr1 and Tr2 are respectively connected to the drains of n-channel MOS transistors Tr3 and Tr4. The gates of the two transistors Tr3 and Tr4 are connected to each other and to the drain of the transistor Tr1. The sources of the transistors Tr3 and Tr4 are connected to ground GND. The transistors Tr3 and Tr4A configure a current mirror circuit.

The drain of the transistor Tr2 is connected to the gate of an n-channel MOS transistor Tr5, the drain of the transistor Tr5 is connected to the node N1, and the source of the transistor Tr5 is connected to the ground GND. A current source 6b supplies constant current to the node N1.

The drain of the transistor Tr2 is connected to the gate of an n-channel MOS transistor Tr6 via a switch circuit 7. The gate of the transistor Tr6 is connected to the ground GND via a capacitor 8. The source of the transistor Tr6 is connected to the ground GND. The current IsinkP is output as the drain current of the transistor Tr6.

The switch circuit 7 closes for a predetermined time in predetermined sampling cycles and supplies the drain current of the transistor Tr2 to the capacitor 8. Therefore, the capacitor 8 holds a voltage corresponding to the input voltage IP. The conversion section 5b has the same configuration as the conversion section 5a, and the sampling/holding timings of the conversion sections 5a and 5b are in phase.

In the conversion section 5a of the V/I conversion circuit 1, when the input voltage IP is supplied, the same current flows through the transistors Tr1 and Tr2. Further, based on the drain current of the transistor Tr5 that corresponds to the drain voltage of the transistor Tr2, an amplification operation is performed so that the voltage of the node N1 becomes the same as the input voltage IP.

The drain voltage of the transistor Tr2 is held by the capacitor 8. The drain current IsinkP corresponding to the hold voltage of the capacitor 8 flows to the transistor Tr6. Therefore, the conversion section 5a converts the input voltage IP to the current IsinkP. The conversion section 5b operates in the same manner as the conversion section 5a and converts the input voltage IM to the current IsinkM.

When the input voltage IP is higher than the input voltage IM, current corresponding to the potential difference flows from the node N1 towards the node N2 via the reference resistor Rref. When the input voltage IM is higher than the input voltage IP, current corresponding to the potential difference thereof flows from the node N2 towards the node N1 via the reference resistor Rref.

Figure 8:
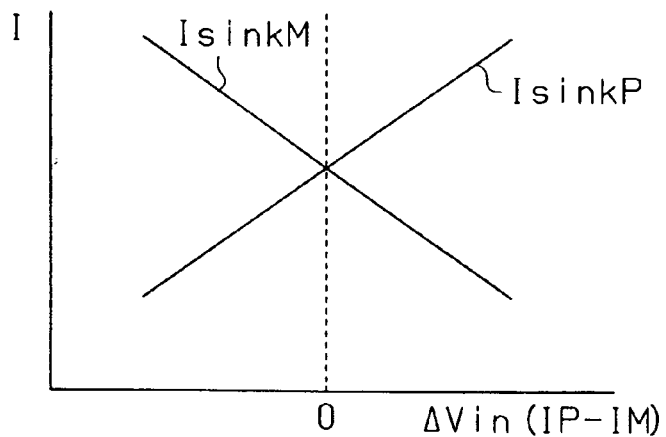
FIG. 8 is a diagram showing the operation of the V/I conversion circuit.

As shown in FIG. 8, in the V/I conversion circuit 1, the currents IsinkP and IsinkM change in accordance with changes in the potential difference ΔVin of the input voltages IP and IM. That is, if the input voltages IP and IM are the same, the currents IsinkP and IsinkM are the same. If the input voltage IP is higher than the input voltage IM, the current IsinkP becomes greater than the current IsinkM. If the input voltage IM is higher than the input voltage IP, the current IsinkM becomes greater than the current IsinkP.

Figure 3A:
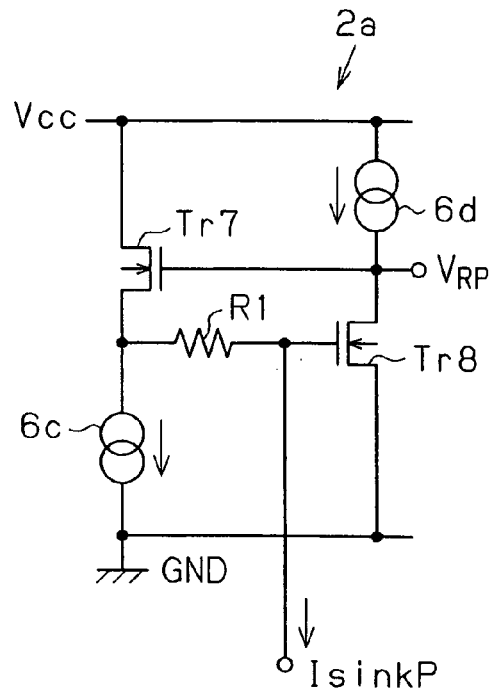
FIGS. 3(a) and 3(b) are schematic circuit diagrams showing an I/V conversion circuit of the current mode A/D converter shown in FIG. 1.
Figure 3B:
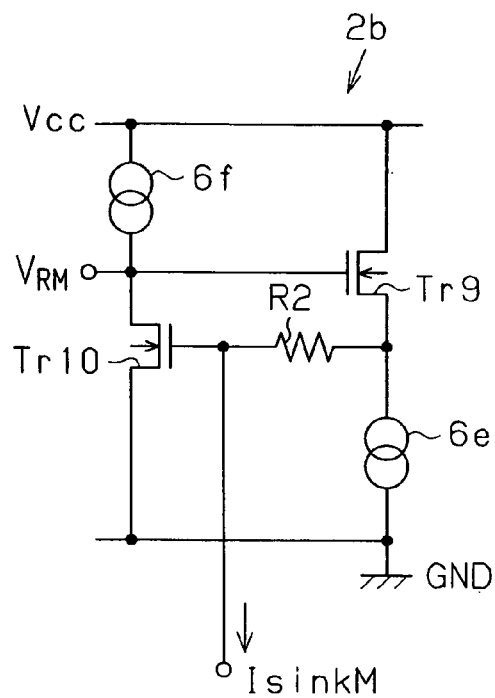

FIG. 3(a) and FIG. 3(b) show the I/V conversion circuits 2a and 2b, respectively. The I/V conversion circuit 2a will now be described. The drain of an n-channel MOS transistor Tr7 is connected to a power supply Vcc, and the source is connected to a constant current source 6c. The gate of the transistor Tr7 is connected to the drain of a transistor Tr8 and to a current source 6d.

The source of the transistor Tr8 is connected to the ground GND, and the gate is connected to the source of the transistor Tr7 via a resistor R1. The output current IsinkP of the conversion section 5a of the V/I conversion circuit 1 is supplied to the gate of the transistor Tr8.

The I/V conversion circuit 2b, which includes transistors Tr9 and Tr10, current sources 6e and 6f, and a resistor R2, is configured in a manner similar to the I/V conversion circuit 2a. The output current IsinkM of the conversion section 5b of the V/I conversion circuit 1 is supplied to the gate of the transistor Tr10.

Figure 4:
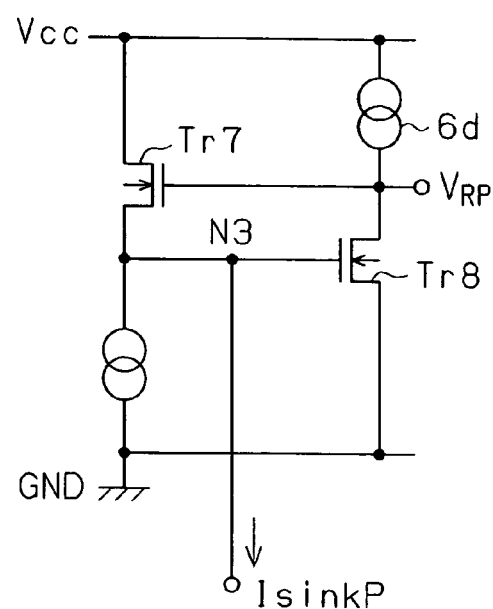
FIG. 4 is a schematic circuit diagram showing a basic circuit of the I/V conversion circuit shown in FIG. 3(a)

The operation of the I/V conversion circuit 2a will now be described with reference to FIG. 4. In FIG. 4, the resistor R1 is omitted from the configuration of FIG. 3(a) to simplify description. In FIG. 4, the transistor Tr8 is driven by a constant drain current. Thus, the voltage Vgs8 between the gate and the source is a constant voltage. Accordingly, the gate voltage of the transistor Tr8 is constant, and the supply terminal of the current IsinkP is set to a constant voltage.

When the current IsinkP is 0, constant current flows from the current source 6c to the source of the transistor Tr7. Thus, the voltage Vgs7 between the gate and source is a constant voltage. Accordingly, the comparison voltage $V_{RP}$ supplied from the drain of the transistor Tr8 is set to a constant voltage of Vgs8+Vgs7.

When the current IsinkP is not 0, the drain current of the transistor Tr7 is set to the sum of the current IsinkP and the constant current of the current source 6c. This changes the voltage Vgs7 between the gate and the source in accordance with the change in the current IsinkP. It is preferred that the change of the voltage Vgs7 between the gate and the source be linear with respect to the change in the current IsinkP. However, it does not have to be linear if there is a correlation with a circuit in a subsequent stage. Due to such operation, the comparison voltage $V_{RP}$ changes in accordance with the current IsinkP, and current-voltage conversion is performed.

As shown in FIG. 3(a), when the resistor R1 is employed, the current IsinkP flows to the resistor R1. Thus, when the comparison voltage $V_{RP}$ changes in accordance with the current IsinkP, an amount corresponding to the voltage drop caused by the resistor R1 is added to the comparison voltage $V_{RP}$.

Due to such operation, the I/V conversion circuit 2a converts the current IsinkP to voltage. Further, the gate voltage of the transistor Tr8, which functions as the supply node of the current IsinkP, is a constant voltage irrespective of the change in the current IsinkP. The comparison voltage $V_{RP}$ changes in a substantially linear manner in accordance with changes in the current IsinkP.

The I/V conversion circuit 2b also operates in a manner similar to the I/V conversion circuit 2a and converts the current IsinkM to the comparison voltage $V_{RM}$.

Figure 9:
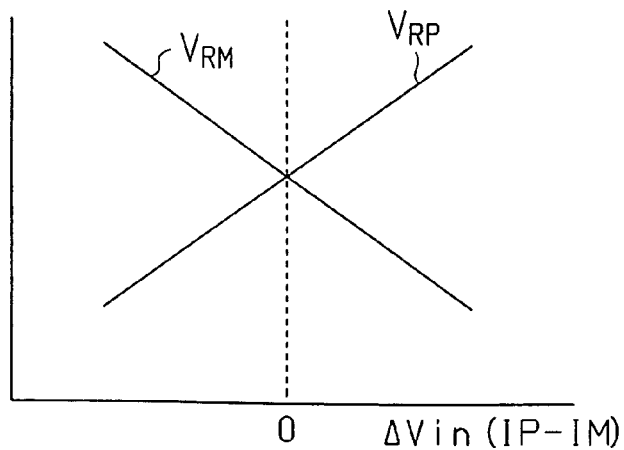
FIG. 9 is a diagram showing the operation of the I/V conversion circuit.

As shown in FIG. 9, in the I/V conversion circuits 2a and 2b, the comparison voltages $V_{RP}$ and $V_{RM}$ change in accordance with changes in the potential difference ΔVin of the input voltages IP and IM, that is, changes in the currents IsinkP and IsinkM. In other words, if the input voltages IP and IM are the same, the comparison voltages $V_{RP}$ and $V_{RM}$ are the same. If the input voltage IP is higher than the input voltage IM, the comparison voltage $V_{RP}$ becomes higher than the comparison voltage $V_{RM}$. If the input voltage IM is higher than the input voltage IP, the comparison voltage $V_{RM}$ becomes higher than the comparison voltage $V_{RP}$.

Figure 5:
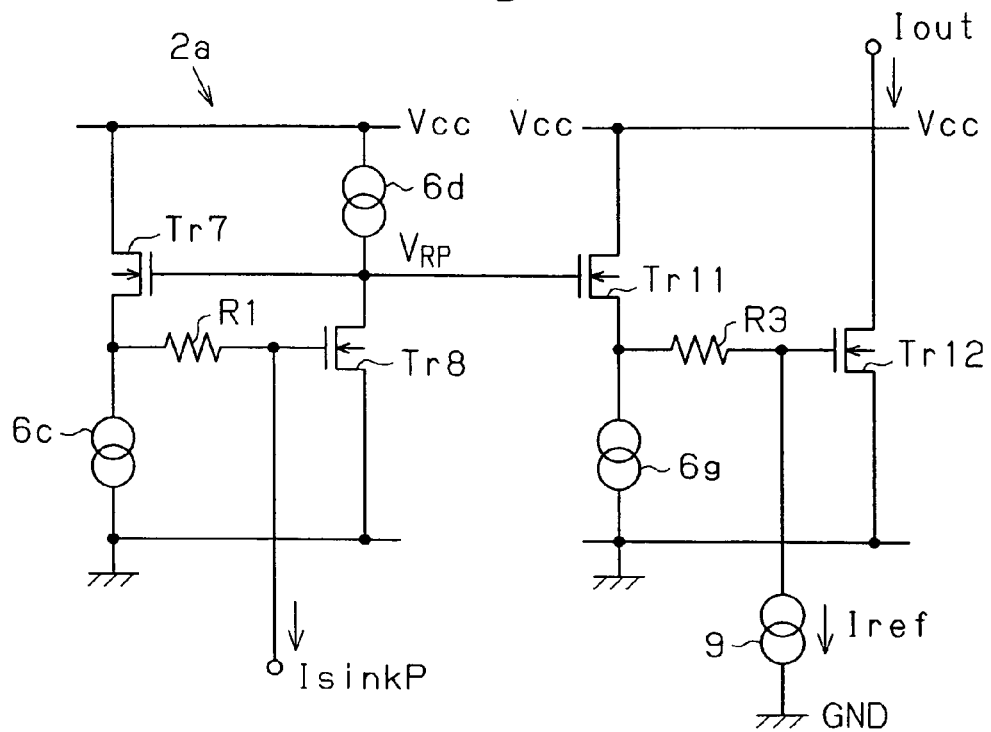
FIG. 5 is a schematic circuit diagram showing a basic operation of a comparator of the current mode A/D converter of FIG. 1.

The comparison voltages $V_{RP}$ and $V_{RM}$ are each supplied to the comparators 3. Each comparator 3 compares the comparison voltages $V_{RP}$ and $V_{RM}$ with a comparison current. The basic operation of each comparator 3 will now be described with reference to FIG. 5. In FIG. 5, the left half of the circuit is the I/V conversion circuit 2a. The right half of the circuit is configured in a manner similar to the I/V conversion circuit 2a and includes transistors Tr11 and Tr12, a resistor R3, and a current source 6g. A current source 9, which supplies the reference current Iref, is connected to the gate of the transistor Tr12. The comparison voltage $V_{RP}$ is supplied to the gate of the transistor Tr11. FIG. 5 describes the basic operation of each comparator 3. The configuration of each comparator 3 will be described in detail with reference to FIG. 6.

The transistor Tr7 and the transistor Tr11 are of the same scale. The transistor Tr8 and the transistor Tr12 are of the same scale. The resistors R1 and R3 have the same resistance value. The current sources 6c and 6g supply the same current. Since the comparison voltage $V_{RP}$ is supplied to the gates of the transistors Tr7 and Tr11, if the current IsinkP and the reference current Iref are the same, the drain currents of the transistors Tr8 and Tr12, that is, the supply current of the current source 6d and the output current Iout are the same.

The output current Iout increases as the current IsinkP becomes greater than the reference current Iref. The output current Iout decreases as the current IsinkP becomes smaller than the reference current Iref. Due to such operation, current comparison between the current IsinkP and the reference current Iref is performed with the comparison voltage $V_{RP}$. The transistors Tr11 and Tr12 operate as a current conversion section for converting the comparison voltage $V_{RP}$ to current. The transistors Tr11 and Tr12 also operate as a comparison section for comparing the current IsinkP and the reference current Iref.

Figure 6:
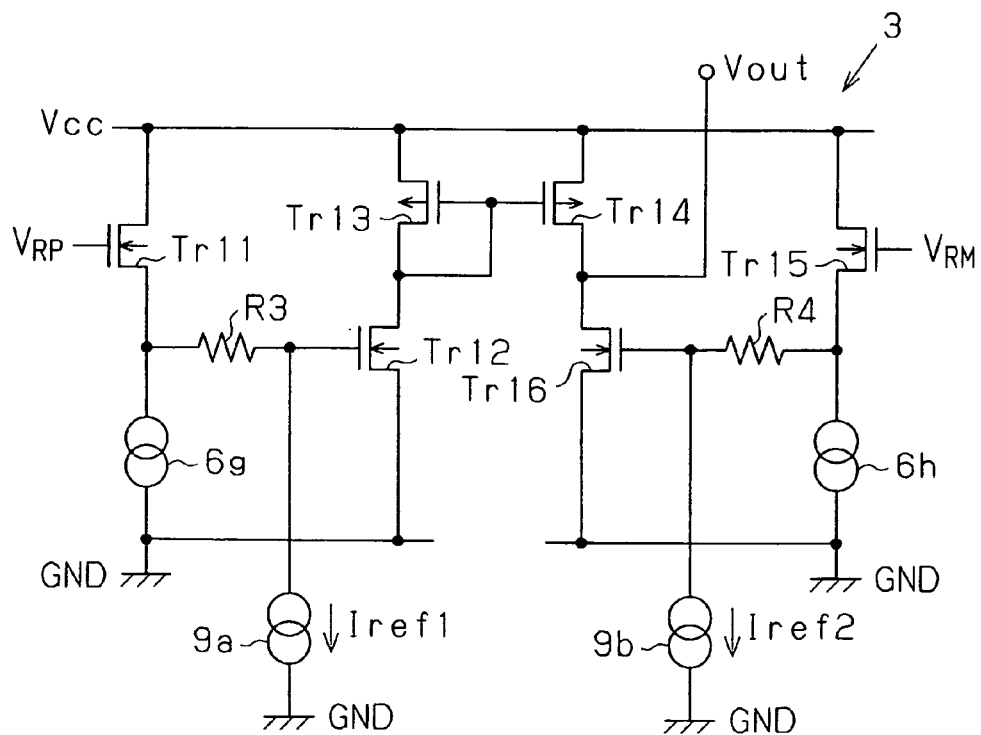
FIG. 6 is a schematic circuit diagram showing the comparator of the current mode A/D converter shown in FIG. 1.

FIG. 6 is a schematic circuit diagram showing the configuration of the comparator 3 in detail. In FIG. 6, the comparator 3 includes a comparison voltage $V_{RP}$ circuit (same configuration as the right half of the circuit of FIG. 5), a comparison voltage $V_{RM}$ circuit, and transistors Tr13 and Tr14. The comparison voltage $V_{RP}$ circuit includes the transistors Tr11 and Tr12, the resistor R3, and the current sources 6g and 9a. The comparison voltage $V_{RM}$ circuit includes transistors Tr15 and Tr16, a resistor R4, and current sources 6h and 9b.

The comparison voltage $V_{RP}$ is supplied to the gate of the transistor Tr11. The drain of the transistor Tr11 is connected to the power supply Vcc. The source is connected to the current source 6g. The constant current flows from the source to the ground GND.

The source of the transistor Tr11 is connected to the gate of the transistor Tr12 via the resistor R3. The source of the transistor Tr12 is connected to the ground GND. The current source 9a is connected to the gate of the transistor Tr12. Reference current Iref1 flows from the source of the transistor Tr11 to the ground GND via the resistor R3.

The drain of the transistor Tr12 is connected to the power supply Vcc via the p-channel MOS transistor Tr13. The gate of the transistor Tr13 is connected to the gate of the p-channel MOS transistor Tr14 and to the drain of the transistor Tr12.

The drain of the transistor Tr14 is connected to the power supply Vcc. The transistors Tr13 and Tr14 configure a current mirror circuit.

The comparison voltage $V_{RM}$ is supplied to the gate of the transistor Tr15. The drain of the transistor Tr15 is connected to the power supply Vcc. The source of the transistor Tr15 is connected to the current source 6h. The constant current flows from the source to the ground GND.

The source of the transistor Tr15 is connected to the gate of the transistor Tr16 via the resistor R4, and the source of the transistor Tr16 is connected to the ground GND. The gate of the transistor Tr16 is connected to the current source 9b, and the reference current Iref2 flows from the source of the transistor Tr15 to the ground GND via the resistor R4.

The drain of the transistor Tr16 is connected to the drain of the transistor Tr14. The output signal Vout is output from the drains of the transistors Tr16 and Tr14.

Figure 7:
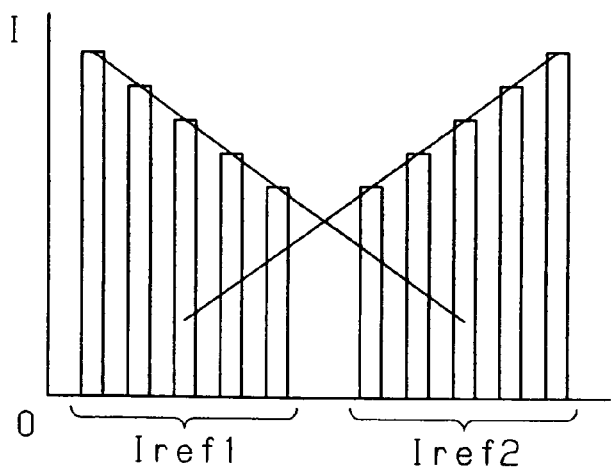
FIG. 7 is a diagram showing a reference current supplied to the comparator.

The reference currents Iref1 and Iref2 are each set with a different current value for each comparator 3. Five comparators 3 are shown in FIG. 1 to facilitate description. However, for example, in the case of an A/D converter for ten bits, 1024 comparators C1 to C1024 are used. Referring to FIG. 7, there are 1024 reference currents Iref2 for the comparators C1 to C1024, and the 1024 reference currents are sequentially supplied to the comparators C1 to C1024 from those having high current values to those having low current values. Further, there are 1024 reference currents Iref1, and the 1024 reference currents are sequentially supplied to the comparators C1 to C1024 from those having low current values to those having high current values.

The comparator 3 generates an output signal Vout having an H level or L level based on the potential difference of the comparison voltages $V_{RP}$ and $V_{RM}$ (i.e., difference in current values of the currents IsinkP and IsinkM) and the reference currents Iref1 and Iref2. When the 1024 comparators C1 to C1024 are used, the number of comparators for generating the H level output signal gradually increases from comparator C1 to C1024 as the difference in the current values of the currents IsinkP and IsinkM increases.

The output signal of the comparator 3 is provided to the encoder 4. The encoder 4 converts the output signal of each comparator 3 to a digital binary signal.

In the A/D converter 100, the V/I conversion circuit 1 converts the potential difference of the input voltages IP and IM to the currents IsinkP and IsinkM, and the I/V conversion circuits 2a and 2b convert the currents IsinkP and IsinkM to comparison voltages $V_{RP}$ and $V_{RM}$. Each of the comparators 3 receives the comparison voltages $V_{RP}$ and $V_{RM}$ and compares the currents IsinkP and IsinkM and the reference currents Iref1 and Iref2 based on the comparison voltages $V_{RP}$ and $V_{RM}$. The encoder 4 receives the output signal of each comparator 3 and generates the digital output signal.

The A/D conversion circuit 100 of the first embodiment has the advantages described below.

(1) Each of the comparators 3 compares the reference currents Iref1 and Iref2 with the currents IsinkP and IsinkM, which are converted from the input voltages IP and IM. Thus, the difference in the reference currents supplied to each comparator 3 is sufficiently and easily ensured regardless of the lowered power supply voltage. This improves the A/D conversion accuracy.

(2) The input voltages IP and IM are converted to the currents IsinkP and IsinkM. The currents IsinkP and IsinkM are converted again to the comparison voltages $V_{RP}$ and $V_{RM}$, which are supplied to each comparator 3. Accordingly, currents that correspond to the input voltages IP and IM do not need to be supplied to each of the plurality of comparators 3. Thus, the current consumption required for supplying a comparison subject value corresponding to the input voltages IP and IM is reduced. Further, it is easier to supply the same voltage to each comparator 3 than supply the same current to each comparator 3.

(3) The currents IsinkP and IsinkM are compared with the reference currents Iref1 and Iref2 by supplying the comparison voltages $V_{RP}$ and $V_{RM}$ to each comparator 3.

(4) The output terminals of the transistors for outputting the currents IsinkP and IsinkM in the V/I conversion circuit 1 are connected to the gates of the transistors Tr8 and Tr10 of the I/V conversion circuits 2a and 2b. Thus, the connection node for the output terminals of the V/I conversion circuit 1 is set to a constant voltage. This prevents changes in the voltage of the output terminal from changing the currents IsinkP and IsinkM.

(5) The I/V conversion circuits 2a and 2b change the comparison voltages $V_{RP}$ and $V_{RM}$ in a linear manner in accordance with changes in the currents IsinkP and IsinkM.

Figure 10:
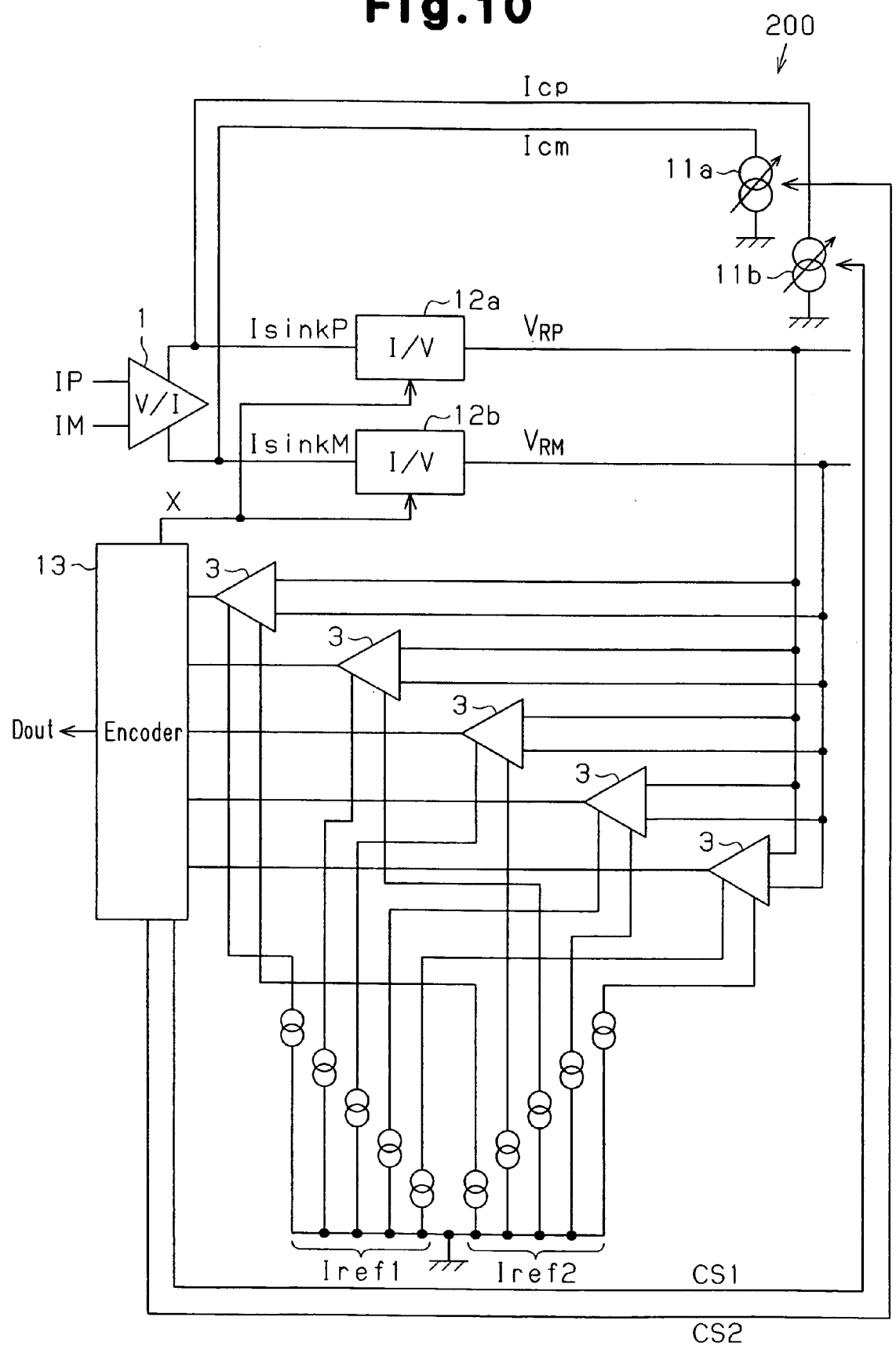
FIG. 10 is a schematic block circuit diagram showing a current mode A/D converter according to a second embodiment of the present invention.

FIG. 10 is a schematic block circuit diagram of a current mode A/D converter 200 according to a second embodiment of the present invention. The current mode A/D converter 200 performs an operation similar to that performed by a serial-parallel A/D converter.

The current mode A/D converter 200 shown in FIG. 10 includes filter current sources 11a and 11b in addition to the configuration of the A/D conversion circuit 100 of FIG. 1. In the A/D converter 200, the configurations of I/V conversion circuits 12a and 12b and the encoder 13 are changed.

The current mode A/D converter 200 generates a digital output signal by performing a conversion operation in two-steps for each sampling of the input voltages IP and IM. The encoder 13 supplies control signals cs1 and cs2 to the filter current sources 11a and 11b based on a first conversion result.

Figure 11:
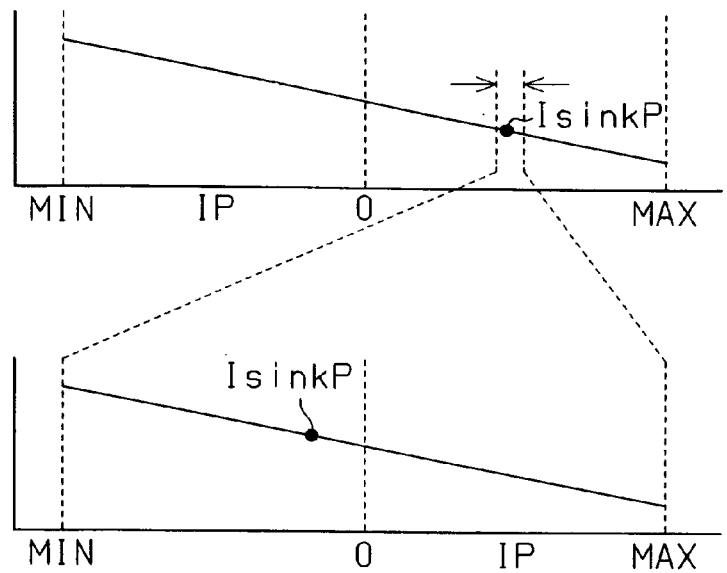
FIG. 11 is a diagram showing the operation of a filter current source of the current mode A/D converter shown in FIG. 10.

The filter current source 11a generates a control current Icm that offsets part of the current IsinkM supplied from the V/I conversion circuit 1 to the I/V conversion circuit 12b in accordance with the control signal cs2. The filter current source 11b generates a control current Icp that offsets part of the current IsinkP supplied from the V/I conversion circuit 1 to the I/V conversion circuit 12a in accordance with the control signal cs1. That is, the current IsinkP supplied to the I/V conversion circuit 12a is limited by the control current Icp, and the current IsinkP is converted to the comparison voltage $V_{RP}$ in the limited range. Further, the current IsinkM supplied to the I/V conversion circuit 12b is limited by control current Icm, and the current IsinkM is converted to the comparison voltage $V_{RM}$ in the limited range. FIG. 11 shows the operation for limiting the range of the current IsinkP by adding the control current Icp.

Figure 12:
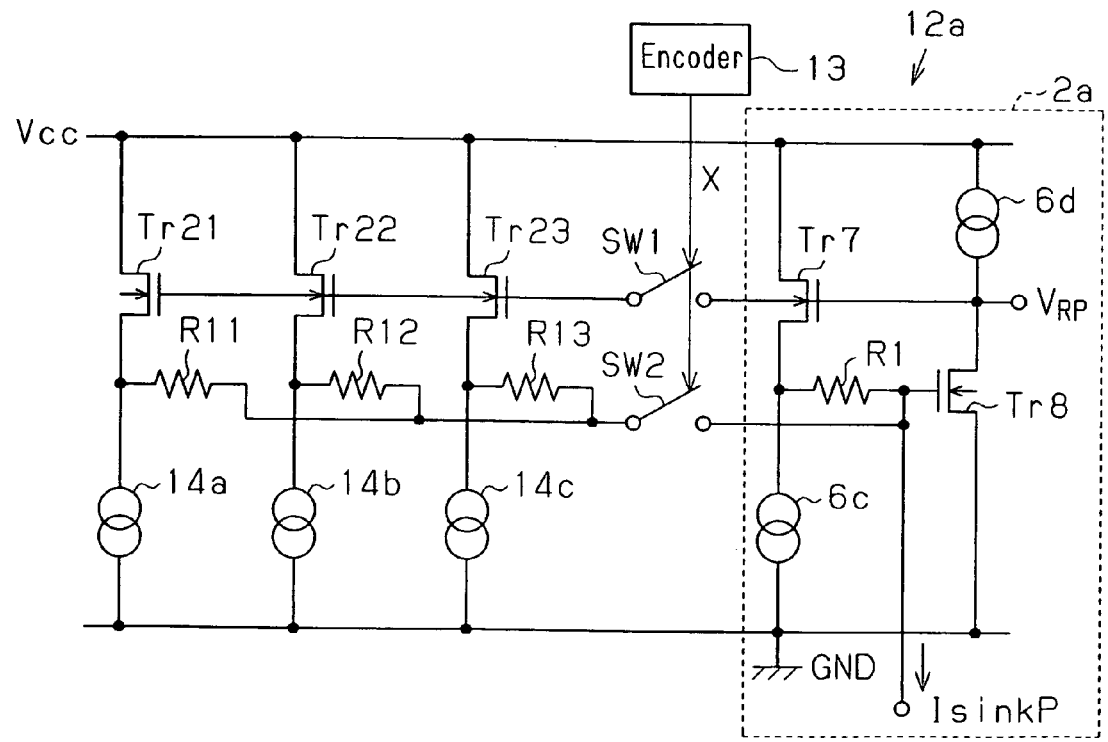
FIG. 12 is a schematic circuit diagram showing an I/V conversion circuit of the current mode A/D converter of FIG. 10.

FIG. 12 shows the configuration of the I/V conversion circuit 12a in detail. The I/V conversion circuit 12a includes the I/V conversion circuit 2a of FIG. 3(a) and three circuits connected in parallel to the I/V conversion circuit 2a. Each of the three circuits has the same configuration as the I/V conversion circuit 2a, which includes the transistor Tr7, the resistor R1, and the current source 6c.

The drains of n-channel MOS transistors Tr21, Tr22, and Tr23 are connected to the power supply Vcc. The sources of the transistors Tr21, Tr22, and Tr23 are respectively connected to current sources 14a, 14b, and 14c. The gates of the transistors Tr21, Tr22, and Tr23 are connected to the gate of the transistor Tr7 via a switch circuit SW1, and the sources of the transistors Tr21, Tr22, Tr23 are connected to the gate of the transistor Tr8 via the resistors R11, R12, R13 and a switch circuit SW2.

The transistors Tr21, Tr22, and Tr23 have the same scale as the transistor Tr7. The resistors R11, R12, and R13 each have the same resistance value as the resistor R1. The current sources 14a, 14b, and 14c each supply the same current as the current source 6c.

The switch circuits SW1 and SW2 are controlled in accordance with a control signal X provided from the encoder 13. In the two-step conversion operation, switch circuits SW1 and SW2 are activated (closed) in the first step and inactivated (opened) in the second step.

A sensitivity changing circuit is configured by the above circuit. When the switch circuits SW1 and SW2 are switched from an activated state to an inactivated state, current that is four times greater flows to the resistor R1. Thus, the voltage between the gate and the source of the transistor Tr7 becomes four times greater. Accordingly, the I/V conversion circuit 12a increases sensitivity with respect to change in the current IsinkP by substantially four times by inactivating the switch circuits SW1 and SW2, and the changing range of the comparison voltage $V_{RP}$ is expanded by substantially four times. The I/V conversion circuit 12b has a configuration similar to the I/V conversion circuit 12a.

In the A/D converter 200, the switch circuits SW1 and SW2 are activated based on the sampling of the input voltages IP and IM in the first step so as to perform a conversion operation similar to that of the first embodiment.

In the second step, the control signals cs1 and cs2 are provided from the encoder 13 based on the comparison result of the first step to operate the filter current sources 11a and 11b. This limits each of the currents IsinkP and IsinkM respectively supplied to the I/V conversion circuits 12a and 12b.

In this state, the switch circuits SW1 and SW2 are inactivated, and each comparator 3 performs the comparing operation based on the comparison voltages VRP and VRm supplied from the I/V conversion circuits 12a and 12b with the I/V conversion circuits 12a and 12b having increased sensitivity.

The encoder 13 synthesizes the conversion results of the first and the second steps and generates the digital output signal.

The A/D converter 200 of the second embodiment has the advantages described below in addition to the advantages of the A/D converter 100 of the first embodiment.

(1) The plurality of steps in the conversion operation increases the resolution.

(2) The plurality of steps in the conversion operation maintains a predetermined resolution even if the number of comparators 3 is reduced. Further, reduction in the number of comparators 3 decreases power consumption.

It should be apparent to those skilled in the art that the present invention may be embodied in many other specific forms without departing from the spirit or scope of the invention. Particularly, it should be understood that the present invention may be embodied in the following forms.

In an I/V conversion circuit, p-channel MOS transistors may be used in place of n-channel MOS transistors by reversing the direction of the current.

In the second embodiment, a third step may be performed following the first and the second steps to improve the conversion sensitivity.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. An A/D converter comprising:
    a V/I conversion circuit for converting input voltage to current;
    an I/V conversion circuit, connected to the V/I conversion circuit, for converting the current of the V/I conversion circuit to voltage as a comparison voltage;
    a plurality of comparators connected to the I/V conversion circuit, each comparator receiving the comparison voltage from the I/V conversion circuit, comparing current based on the comparison voltage with a reference current, and generating a comparison signal indicating the comparison result; and
    an encoder, connected to the comparators, for generating a digital output signal using the comparison signals of the comparators.

2. The A/D converter according to claim 1, wherein each of the comparators includes:
    a current conversion section for converting the comparison voltage to the current; and
    a comparison section for comparing the current converted by the current conversion section with the reference current.

3. The A/D converter according to claim 1, wherein the V/I conversion circuit includes a MOS transistor having a drain as a node for outputting the current, and the I/V conversion circuit includes a transistor, having a gate as a node for inputting the current of the V/I conversion circuit, driven by a constant drain current.

4. The A/D converter according to claim 1, wherein the I/V conversion circuit includes:
    a resistor through which the current supplied from the V/I conversion circuit flows; and
    a MOS transistor connected to the resistor and including a source, supplied with voltage generated due to voltage drop at the resistor, and a gate, for outputting the comparison voltage.

5. The A/D converter according to claim 1, wherein the encoder generates the digital output signal for one input voltage using a comparison signal obtained in a first step and a comparison signal obtained in a second step by the comparators, the A/D converter further comprising:
    a filter current source, connected to the V/I conversion circuit and the I/V conversion circuit, for limiting the current supplied to the I/V conversion circuit in the second step.

6. The A/D converter according to claim 5, wherein the I/V conversion circuit includes a sensitivity changing circuit for increasing input sensitivity of the current in the second step.

7. The A/D converter according to claim 6, wherein the sensitivity changing circuit includes a plurality of resistors through which the current supplied from the V/I conversion circuit flows, with change in the comparison voltage with respect to change in the current in the second step being amplified by changing the number of the resistors.

8. The A/D converter according to claim 1, wherein the V/I conversion circuit includes:
    a first transistor including a gate, for receiving the input voltage, and a source;
    a second transistor including a source, connected to the source of the first transistor, a gate, and a drain;
    a third transistor including a gate, connected to the drain of the second transistor, and a drain connected to the gate of the second transistor;
    a switch connected to the drain of the second transistor and the gate of the third transistor;
    a capacitor connected to the switch; and
    a fourth transistor including a gate, connected to a node between the capacitor and the switch, with the current of the V/I conversion circuit flowing through the fourth transistor.

9. The A/D converter according to claim 1, wherein the I/V conversion circuit includes:
    a first transistor including a gate, for receiving the current of the V/I conversion circuit, and a drain;
    a resistor connected to the gate of the first transistor; and
    a second transistor including a source, connected to the resistor, and a gate, connected to the drain of the first transistor, with the comparison voltage being generated at the drain of the first transistor.

10. The A/D converter according to claim 1, wherein each of the plurality of comparators includes:
    a first transistor including a gate, for receiving the comparison voltage of the I/V conversion circuit, and a source;
    a resistor connected to the source of the first transistor, the reference current being supplied to a node between the source of the first transistor and the resistor; and
    a second transistor including a gate, connected to the resistor, and a drain for outputting the comparison signal.

11. The A/D converter according to claim 1, wherein the I/V conversion circuit includes:
    a first circuit including:
        a first transistor having a gate, for receiving the current of the V/I conversion circuit, and a drain;
        a resistor connected to the gate of the first transistor; and
        a second transistor having a source, connected to the resistor, and a gate, connected to the drain of the first transistor, with the comparison voltage being generated at the drain of the first transistor;
    a switch connected to the first circuit; and
    a plurality of second circuits connected in parallel to the switch, each of the plurality of second circuits including:
        a resistor through which the current of the V/I conversion circuit flows; and
        a third transistor having a source, connected to the resistor, and a gate, connected to the switch.

* * * * *